United States Patent
Grodzki et al.

(10) Patent No.: US 9,829,553 B2
(45) Date of Patent: Nov. 28, 2017

(54) METHOD AND MAGNETIC RESONANCE SYSTEM FOR FUNCTIONAL MR IMAGING OF A PREDETERMINED VOLUME SEGMENT OF THE BRAIN OF A LIVING EXAMINATION SUBJECT

(71) Applicants: David Grodzki, Erlangen (DE); Bjoern Heismann, Erlangen (DE); Jeanette Lenger, Wuerzburg (DE); Sebastian Schmidt, Weisendorf (DE)

(72) Inventors: David Grodzki, Erlangen (DE); Bjoern Heismann, Erlangen (DE); Jeanette Lenger, Wuerzburg (DE); Sebastian Schmidt, Weisendorf (DE)

(73) Assignee: Siemens Aktiengesellschaft, Munich (DE)

(*) Notice: Subject to any disclaimer, the term of this patent is extended or adjusted under 35 U.S.C. 154(b) by 1273 days.

(21) Appl. No.: 13/857,311

(22) Filed: Apr. 5, 2013

(65) Prior Publication Data
US 2013/0265050 A1 Oct. 10, 2013

(30) Foreign Application Priority Data
Apr. 5, 2012 (DE) .................. 10 2012 205 626

(51) Int. Cl.
*G01R 33/54* (2006.01)
*G01R 33/48* (2006.01)
*G01R 33/561* (2006.01)

(52) U.S. Cl.
CPC ......... *G01R 33/4806* (2013.01); *G01R 33/54* (2013.01); *G01R 33/5619* (2013.01); *G01R 33/4816* (2013.01)

(58) Field of Classification Search
USPC ................... 324/300–322; 600/407–435; 382/128–131
See application file for complete search history.

(56) References Cited

U.S. PATENT DOCUMENTS

| | | | | |
|---|---|---|---|---|
| 6,618,607 B2 * | 9/2003 | Song | ................. | G01R 33/4806 324/312 |
| 7,288,936 B2 * | 10/2007 | Larson | ................. | G01R 33/446 324/307 |
| 7,474,097 B2 * | 1/2009 | Bydder | ................. | G01R 33/561 324/307 |
| 7,602,184 B2 * | 10/2009 | Du | ................. | G01R 33/4824 324/307 |

(Continued)

OTHER PUBLICATIONS

Waldman et al, :"MRI of the Brain with Ultra-Short Echo-Time Pulse Sequences," Neuroradiology (2003) vol. 45, pp. 887-892.

(Continued)

*Primary Examiner* — Melissa Koval
*Assistant Examiner* — Tiffany Fetzner
(74) *Attorney, Agent, or Firm* — Schiff Hardin LLP (57) ABSTRACT

In a method and a magnetic resonance (MR) system for functional MR imaging of a predetermined volume segment of THE brain of a living examination subject, an RF excitation pulse is radiated into the subject and at least one magnetic field gradient is activated, and MR data of the predetermined volume segment is acquired beginning at a predetermined echo time after the RF excitation pulse. The echo time is in a time period of 10 μs to 1000 μs.

11 Claims, 4 Drawing Sheets

(56) References Cited

U.S. PATENT DOCUMENTS

| | | | |
|---|---|---|---|
| 8,148,979 B1* | 4/2012 | Du | G01R 33/4816 324/307 |
| 8,723,517 B2* | 5/2014 | Takahashi | G01R 33/4816 324/307 |
| 2007/0080685 A1* | 4/2007 | Bydder | G01R 33/561 324/309 |
| 2007/0255129 A1 | 11/2007 | Du et al. | |
| 2008/0258727 A1* | 10/2008 | Qian | G01R 33/4816 324/312 |
| 2009/0009167 A1* | 1/2009 | Du | G01R 33/4824 324/307 |
| 2012/0019243 A1* | 1/2012 | Takahashi | G01R 33/4816 324/309 |
| 2013/0265050 A1* | 10/2013 | Grodzki | G01R 33/4806 324/309 |

OTHER PUBLICATIONS

Grodzki et al. "Ultrashort Echo Time Imaging Using Pointwise Encoding Time Reduction with Radial Acquistion, (PETRA)" Magn. Reson. Med. vol. 67 (2012) pp. 510-518.

Nielles-Vallespin et al., "3D Projection Technique With Ultrashort Echo Times for Sodium MRI: Clinical Applications in Human brain and Skeletal Muscle," Magnetic Resonance in Medicine Vo. 57, (2007) pp. 74-81.

Mangia et al., "Detection of the Brain Activation Using Quiet MRI Without Echo," Proc. ENC Conference 2011.

Gatehouse "Clinical imaging of the brain with Ultrashort TE(Ute) pulse sequences"; Proc. Intl. Cos. Mag. Reson. Med. 11; pp. 2268; (2003).

Bernstein et al., "Handbook of MRI Pulse Sequences," pp. 384-392 (2004).

\* cited by examiner

METHOD AND MAGNETIC RESONANCE SYSTEM FOR FUNCTIONAL MR IMAGING OF A PREDETERMINED VOLUME SEGMENT OF THE BRAIN OF A LIVING EXAMINATION SUBJECT

BACKGROUND OF THE INVENTION

Field of the Invention

The present invention concerns a method and a magnetic resonance system for functional MR imaging with which in particular brain activities can be graphically depicted.

Description of the Prior Art

A non-invasive examination of brain activities is possible with functional nuclear magnetic resonance tomography (fMRI). Comparison measurements with regard to the brain of the patient in a steady state, and the brain after being exposed to stimuli, show which brain regions are stimulated or affected, and how strongly, by the stimuli. The stimuli can be of pain stimuli, optical stimuli, acoustic stimuli or other stimulation, for example the placement of a block of ice on the skin.

According to the prior art, most often the BOLD ("Blood Oxygen Level Dependent") signal is measured in fMRI examinations. The BOLD signal is dependent on the oxygen concentration within the blood. The susceptibility of blood changes depending on the oxygen content therein, which in turn can be detected by MR measurements. In other words: in fMRI, with suitable methods it is determined at which points of the brain the oxygen reaction changes with and without stimulus. The activity of individual brain regions is then directly identified from these results. According to the prior art, fast measurement methods that operate with an EPI sequence ("Echoplanar Imaging") are used, for example.

SUMMARY OF THE INVENTION

An object of the present invention is to improve functional MR imaging compared to the prior art.

Within the scope of the present invention, a method is provided for functional MR imaging of a predetermined volume segment of the brain of a living examination subject that includes the following steps of radiating an RF excitation pulse in the examination subject, of the resulting MR signal, activating one or more magnetic field gradients for spatial coding and acquiring MR data within the predetermined volume segment, wherein a predetermined echo time after the RF excitation pulse starting with the data acquisition. The echo time determines the time period between the middle of the RF excitation pulse and the beginning of the data acquisition.

The echo time thus is ultrashort, such that it is in a time duration from 10 μs to 1000 μs.

The contrast of the MR images created from the MR data can be optimized by a flexible change of the echo time between 10 and 1000 μs, with a transition to the BOLD contrast also being possible.

In an embodiment of the invention, T1-selective or T2-selective pre-pulses are activated before the RF excitation pulse in order to improve a contrast of the MR images created from the MR data.

T1 pre-pulses consist of a 180° inversion pulse that is radiated in a predetermined time period before the actual RF excitation pulse. Up to 500 repetitions can be measured after such a T1 pre-pulse. The T2 pre-pulse is also radiated before the actual RF excitation pulse and likewise enables multiple repetitions. Moreover, according to the invention fat or water saturation pulses can be used, which are likewise radiated before the RF excitation pulse. According to the invention, these pre-pulses can be used in all conceivable sequences with ultra-short echo time without the adjustment of the echo time having an effect on the selected pre-pulse, or the pre-pulse having an effect on the adjusted echo time.

The following embodiments according to the invention are available in order to realize the ultra-short echo time:

1. The magnetic field gradients required for spatial coding are ramped up simultaneously with the beginning of the data acquisition.

2. The magnetic field gradients required for spatial coding are ramped up before the switching of the RF excitation pulse, such that the magnetic field gradients have already been switched upon acquisition of the MR data.

In the first embodiment described above, in which the magnetic field gradients are ramped up simultaneously with the beginning of the data acquisition, both two-dimensional MR measurements and three-dimensional MR measurements can be implemented. In the first embodiment the sequence known as UTE ("Ultrashort Echo Time") can be used, for example. In order to ensure an ultrashort echo time of 40 μs, in the first embodiment no hardware change is necessary. This means that a normal clinical scanner can be operated since, even given such a scanner, the minimum time between a transmission process and a reception process is sufficient in order to ensure an echo time of 40 μs.

In the second embodiment described above, in which the magnetic field gradients have already been switched before the RF excitation pulse, the magnetic field gradients advantageously remain continuously activated and are only incrementally varied. The noise development of a corresponding method according to the invention is thereby markedly less than given methods for fMRI according to the prior art, in which the magnetic field gradients must be deactivated upon radiation of the RF excitation pulse and therefore must be reactivated for data acquisition.

In a variant of the second embodiment, MR data entered into the k-space points in the center (middle region) of k-space are acquired by single point imaging (SPI). In single point imaging, the k-space point is scanned (i.e., it is filled, or an entry is made therein) directly after excitation with the RF excitation pulse, for example by the free induction signal being detected.

Since the magnetic field gradients for spatial coding in the second embodiment have already been activated upon radiation of the RF excitation pulse, the spatial coding essentially begins with the radiation of the RF excitation pulse. The acquisition of the k-space points in the center of k-space is therefore technically difficult to realize. The described variant of the second embodiment solves this problem by the k-space points in the center of k-space being acquired by single point imaging.

According to the invention, it is possible for a k-space point within the middle region of k-space to be acquired more often than a k-space point in an outer region of k-space. The outer region lies outside of the middle region in k-space, which corresponds to the predetermined volume segment. Overall, k-space is a combination of the middle region and the outer region.

The invention is based on the insight that the signal changes to be expected in fMRI can be measured primarily in the center of k-space. It is therefore advantageous to scan the middle region of k-space more often than the outer region.

The following two variants exist to create the MR images from the MR data acquired in such a manner, with the middle region having been scanned more often than the outer region:

The MR data of the middle region scanned more often are combined, for example in that a mean value for repeatedly scanned k-space points is calculated. Expressed in a different way: the data repeatedly acquired for a k-space point are used to improve the quality of the MR data. For example, the influence of interferences (due to magnetic field fluctuations, for example) can thereby be eliminated.

Multiple MR images are reconstructed from MR data which respectively have respective separate MR data for the middle region but the same MR data for the outer region. In other words: these same MR data for the outer region are used to reconstruct multiple MR images.

In a preferred embodiment according to the invention, k-space is scanned in multiple successive time windows or time intervals. In each of these time windows, MR data are thereby acquired from which multiple MR images of the predetermined volume segment are then created. During each of these time windows, the k-space points are scanned a predetermined number of times in the middle region. This predetermined number thereby corresponds to the number of MR images which are acquired for each of the time windows. In contrast to this, during each time window the k-space points in the outer region of k-space are only acquired once, such that the same MR data of the outer region which were acquired within the corresponding time window are used to reconstruct each MR image of the same time window.

The embodiment described above has an improved time resolution since—in comparison to methods in which each acquired MR datum is used only for reconstruction of one MR image—fewer MR data must be acquired per time unit for an MR image.

The present invention also encompasses a magnetic resonance system for functional MR imaging of a predetermined volume segment of the brain of a living examination subject. The magnetic resonance system has a basic field magnet; a gradient field system; at least one RF transmission antenna; at least one reception coil element; and a control device. The control device serves to control the gradient field system and the at least one RF transmission antenna. Moreover, the control device is designed in order to receive measurement signals which have been acquired by the at least one reception coil element, and to evaluate these acquired measurement signals and create corresponding MR data. The magnetic resonance system begins with the MR data acquisition at a predetermined echo time after the RF excitation pulse, wherein this echo time lies in a time period from 10 to 1000 µs.

The advantages of the magnetic resonance system according to the invention essentially correspond to the advantages of the method according to the invention described in detail in the preceding.

The present invention also encompasses a non-transitory, computer-readable data storage medium encoded with programming instructions that can be loaded into a memory of a programmable control device or a computer of a magnetic resonance system. All or some embodiments of the method according to the invention that are described in the preceding can be executed by the programming instructions being executed in the control device. The programming instructions may make use of standard items such as libraries and auxiliary functions in order to achieve the embodiments of the method. The (software) programming instructions can be a source code (C++, for example) that must still be compiled and linked or that only needs to be interpreted, or an executable software code that has only to be loaded into the computer or control device for execution.

The electronically readable data storage medium may be, for example, a DVD, a magnetic tape or a USB stick on which is stored electronically readable control information.

The present invention is particularly suitable for functional MR imaging, but the present invention is not limited to this preferred field of application, since MR imaging of bones is also possible with the present invention, for example.

DESCRIPTION OF THE PREFERRED EMBODIMENTS

Figure 1:
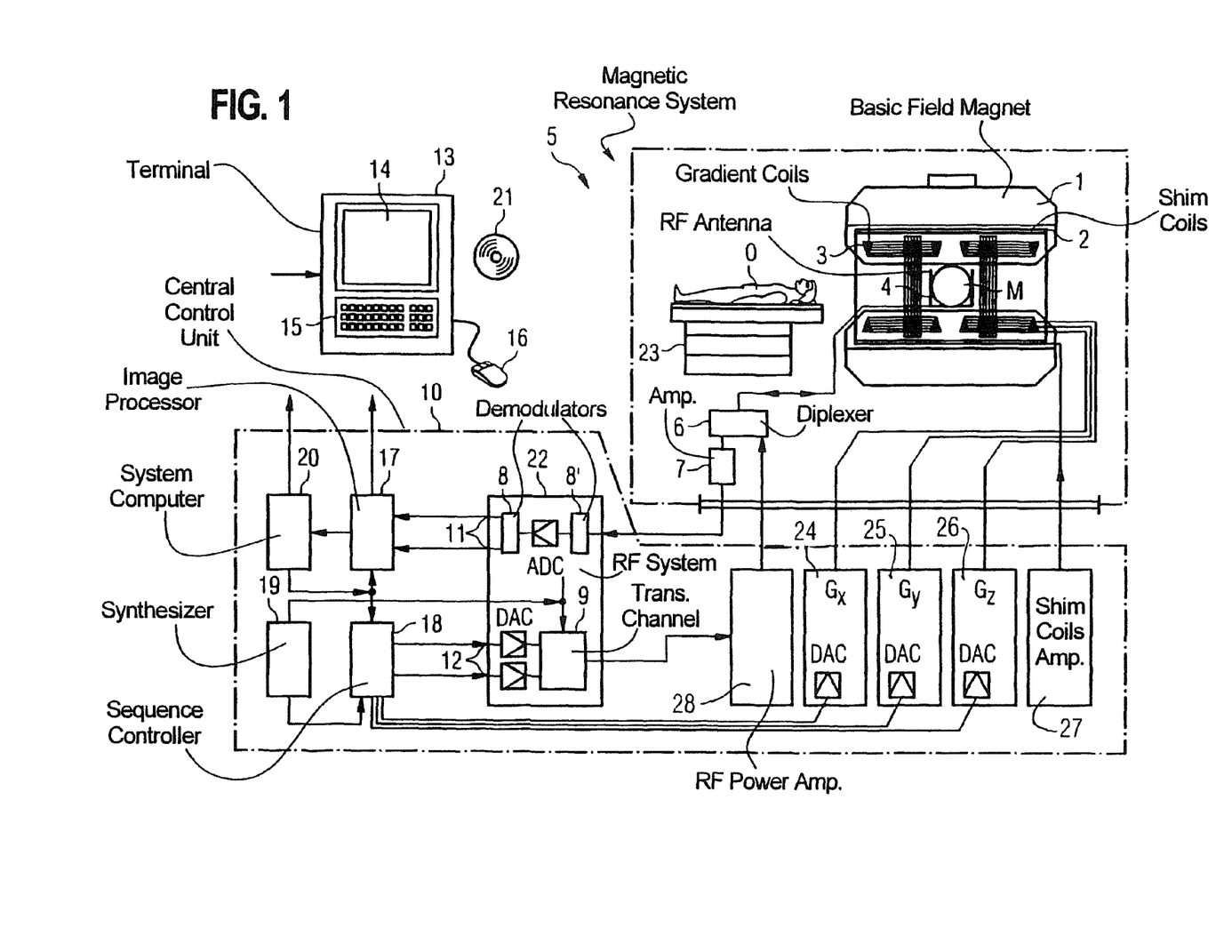
FIG. 1 schematically illustrates a magnetic resonance system according to the invention.

FIG. 1 is a schematic representation of a magnetic resonance system 5 (a magnetic resonance imaging or nuclear magnetic resonance tomography apparatus for fMRI). A basic field magnet 1 generates a temporally constant, strong magnetic field for polarization or alignment of the nuclear spins in a volume segment of a subject O, for example of a brain of a human body lying on a table 23 that is driven into the magnetic resonance system 5 for examination or measurement. The high homogeneity of the basic magnetic field that is required for the magnetic resonance measurement (data acquisition) is defined in a typically spherical measurement volume M into which the parts of the human body that are to be examined are introduced. Shim plates made of ferromagnetic material are attached at suitable points to support the homogeneity requirements, and in particular to eliminate temporally invariable influences. Temporally variable influences are eliminated by shim coils 2 operable by a shim coil amplifier 27.

A cylindrical gradient coil system 3 having three sub-windings is inserted into the basic field magnet 1. Each sub-winding is supplied with current by an amplifier to generate a linear (also temporally variable) gradient field in a respective direction of a Cartesian coordinate system. The first sub-winding of the gradient field system 3 generates a gradient $G_x$ in the x-direction; the second sub-winding generates a gradient $G_y$ in the y-direction; and the third sub-winding generates a gradient $G_z$ in the z-direction. Each amplifier has a digital/analog converter that is operated by a sequence controller 18 for accurately timed generation of gradient pulses.

Located within the gradient field system 3 are one or more radio-frequency antennas 4 that convert the radio-frequency pulses emitted by a radio-frequency power amplifier into an alternating magnetic field for excitation of the nuclei out of the basic filed alignment of the nuclear spins of the subject O to be examined, or of the region of the subject O that is to be examined. Each radio-frequency antenna 4 has one or more RF transmission coils and multiple RF reception coil elements in the form of an annular, linear or matrix-like arrangement of component coils. The alternating field emanating from the precessing nuclear spins—i.e. normally the nuclear spin echo signals caused by a pulse sequence composed of one or more radio-frequency pulses and one or more gradient pulses—is also converted by the RF reception coil elements into a voltage (measurement signal) that is supplied via an amplifier 7 to a radio-frequency reception channel 8 of a radio-frequency system 22. The radio-frequency system 22 furthermore has a transmission channel 9 in which the radio-frequency pulses are generated for the excitation of magnetic resonance signals. The respective radio-frequency pulses are digitally represented in the sequence controller 18 as a series of complex numbers based on a pulse sequence predetermined by the system computer 20. This number sequence is supplied as a real part and imaginary part to respective digital/analog converters (DAC) in the radio-frequency system 22 via respective input 12, and from the digital/analog converters to the transmission channel 9. In the transmission channel 9 the pulse sequences are modulated on a radio-frequency carrier signal having a base frequency that corresponds to the center frequency, and are supplied to an RF power amplifier 28.

The switching from transmission operation to reception operation takes place via a transmission/reception diplexer 6. The RF transmission coil of the radio-frequency antenna 4 radiates the radio-frequency pulses, supplied by the RF power amplifier 28, into the measurement volume M in order to excite nuclear spins in the subject located in the measurement volume M, and receives (detects) the resulting echo signals via the RF reception coils. These acquired magnetic resonance signals are phase-sensitively demodulated to an intermediate frequency in a reception channel 8' (first demodulator) of the radio-frequency system 22 and are digitized in an analog/digital converter (ADC). This signal is further demodulated to a frequency of zero. The demodulation to a frequency of zero and the separation into a real part and an imaginary part occur in a second demodulator 8 after the digitization in the digital domain. An MR image or three-dimensional image data set is reconstructed by the image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of k-space. The sequence controller 18 thereby controls the accurately timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control program are stored on a DVD 21, for example) and the presentation of the generated MR image, take place via a terminal 13 that includes a keyboard 15, a mouse 16 and a monitor 14.

Figure 2:
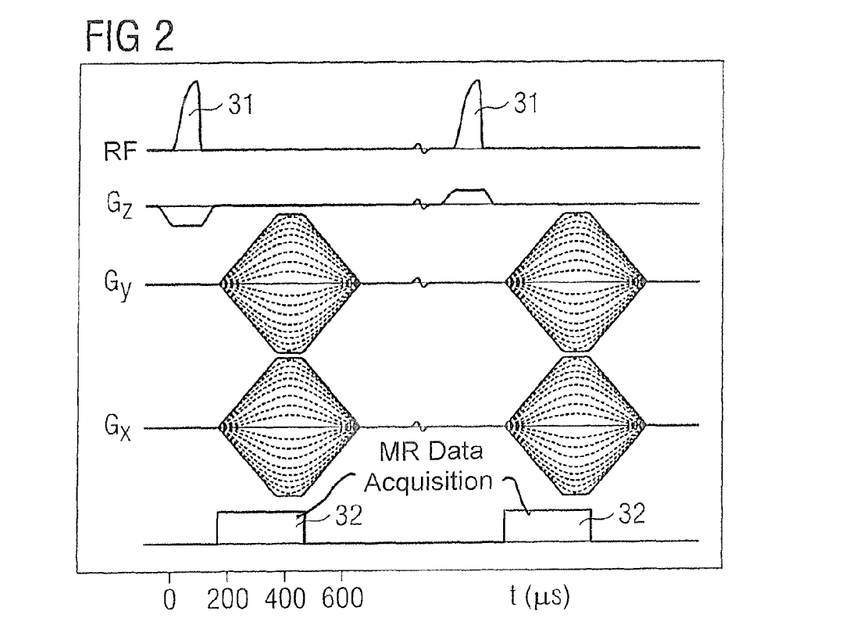
FIG. 2 shows a UTE sequence according to the invention.

A UTE sequence to acquire MR data with an ultrashort echo time for a functional MR imaging is shown in FIG. 2. It can be seen that a slice selection gradient $G_Z$ is activated while the RF excitation pulse 31 is radiated, causing nuclear spins in a slice to be excited that is perpendicular to the z-direction. The magnetic field gradients $G_x$ and $G_y$ are ramped up with the beginning of the MR data acquisition 32.

Figure 3:
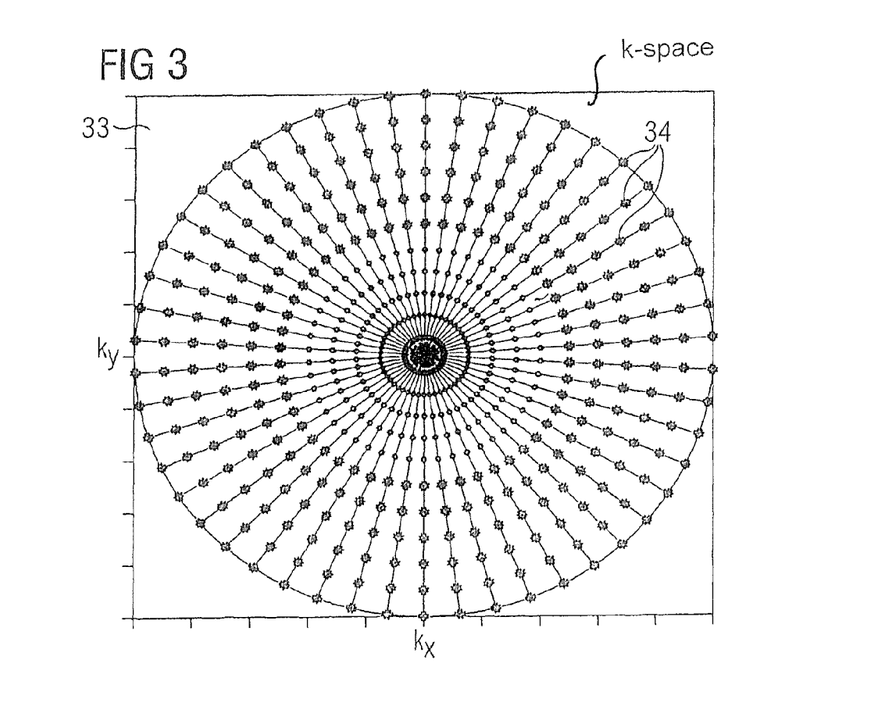
FIG. 3 depicts k-space trajectories for the sequence shown in FIG. 2.

The mathematical domain that is known as k-space 33 is realized as an electronic memory composed of locations at which data entries are made. The trajectories for data entry according to the sequence shown in FIG. 2 is presented in FIG. 3, these trajectories extending radially from a center. According to the invention, the points shown on the trajectories or, respectively, spokes corresponding to scanned k-space points 34. Since, according to the invention, only one slice is excited with the RF excitation pulse 31 and the simultaneously switched magnetic field gradient $G_z$, the embodiment shown in FIGS. 2 and 3 is a two-dimensional MR measurement.

Figure 4:
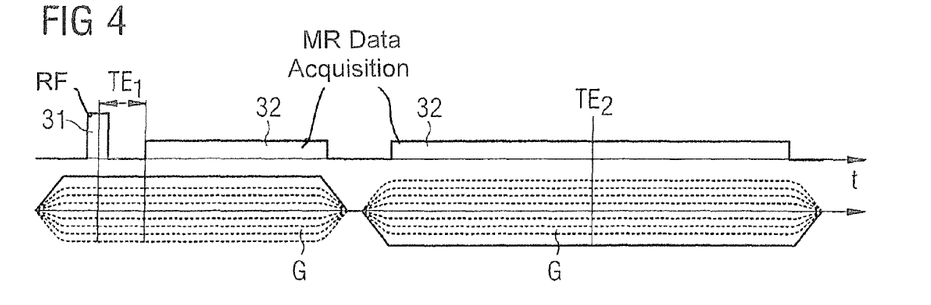
FIG. 4 depicts a sequence according to the invention for the radial acquisition of an outer region of k-space.
Figure 5:
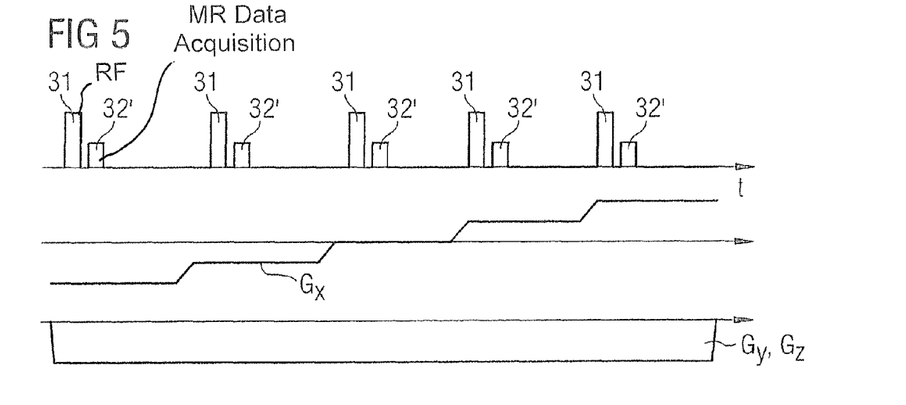
FIG. 5 depicts a sequence according to the invention for single point acquisition of the middle region of k-space.

An additional sequence according to the invention for the acquisition of MR data for functional MR imaging is shown in FIGS. 4 and 5. In this embodiment, the magnetic field gradients G have already been activated when the RF excitation pulse 31 is radiated, as is shown in FIG. 4. The MR data acquisition time period 32 begins an ultrashort echo time $TE_1$ after the RF excitation pulse 31. The echo time $TE_1$ designates the time period from the middle of the RF excitation pulse 31 up to the beginning of the MR data acquisition or, respectively, the MR data acquisition time period 32. During the first MR data acquisition time period 32, k-space points are acquired along half of a radial trajectory 41 which begins at the edge of the middle region 35 and ends at the end of the outer region 36. In contrast to this, k-space points along a full trajectory are acquired with an echo time $TE_2$ during the chronologically following second MR data acquisition time period 32.

A sequence according to the invention for scanning the middle region 35 is shown in FIG. 5. It can be seen that only a short MR data acquisition time period 32' in which respectively only one k-space point is acquired is present after each RF excitation pulse 31. The magnetic field gradient $G_x$ changes incrementally from one MR data acquisition time period 32' to the next MR data acquisition time period 32', such that a k-space line is essentially scanned point by point along the X-axis.

Figure 6:
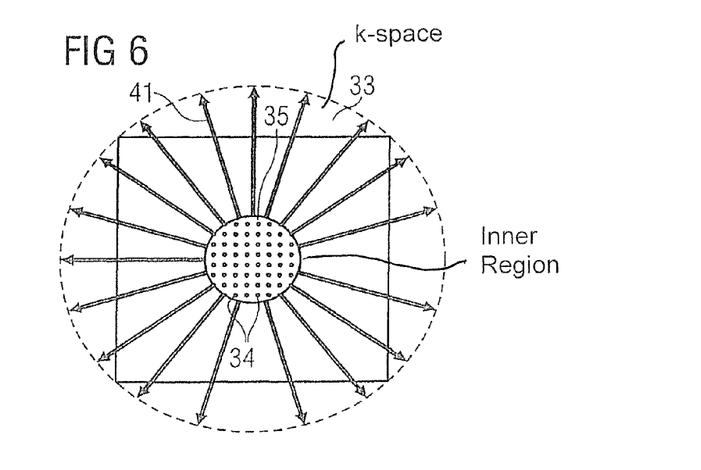
FIG. 6 depicts the k-space acquisition scheme for a slice according to the sequences shown in FIGS. 4 and 5.
Figure 7:
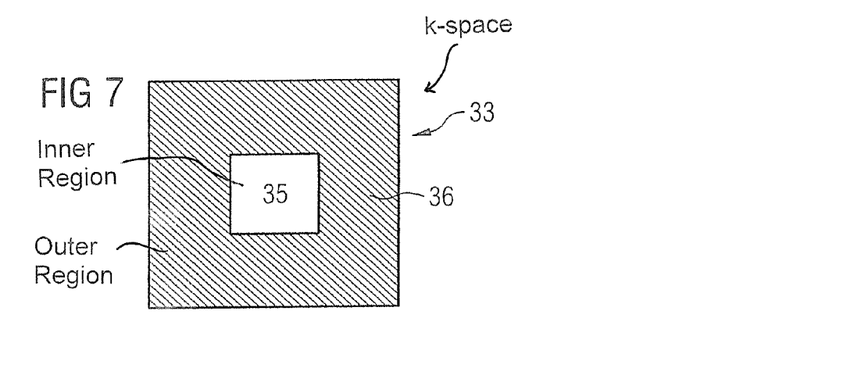
FIG. 7 depicts k-space subdivided into a middle region and an outer region.

The k-space acquisition scheme for a slice through the middle of three-dimensional k-space 33 is shown in FIG. 6. While the k-space points 34 in the middle region 35 are scanned in a Cartesian manner by means of single point imaging (with the use of the sequence shown in FIG. 5), the k-space points in the outer region 36 are scanned radially (with the use of the sequence shown in FIG. 4).

Figure 8:
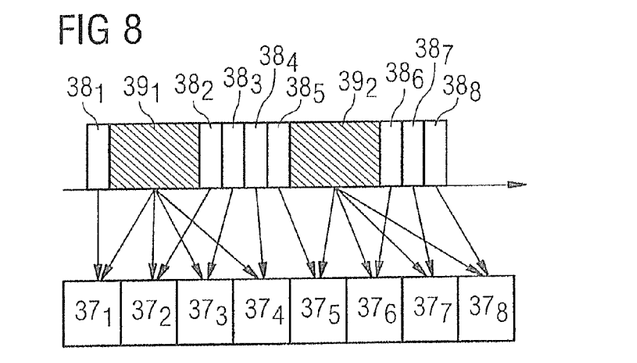
FIG. 8 schematically shows from which MR data the MR images are reconstructed according to the invention.

In FIG. 8 it is schematically shown from which MR data $38_x$, $39_x$ the MR images $37_x$ are reconstructed.

For example, the first MR image $37_1$ is reconstructed from the first MR data $38_1$ of the middle region 35 and the first MR data $39_1$ of the outer region 36. The second MR image $37_2$ is reconstructed from the second MR data $38_2$ of the middle region 35 and from the same first MR data $39_1$ of the outer region 36. The third (fourth) MR image $37_3$ ($37_4$) is reconstructed from the third (fourth) MR data $38_3$ ($38_4$) of the middle region 35 and likewise from the same first MR data $39_1$ of the outer region 36. In other words: the first four MR images $37_1$ through $37_4$ are reconstructed from the same MR data $39_1$ of the outer region 36, wherein the MR data of these MR images $37_1$ through $37_4$ differ only with regard to their MR data $38_1$ through $38_4$ from the middle region 35.

In a similar manner, the last MR images $37_5$ through $37_8$ shown in FIG. 8 are reconstructed from the same MR data $39_2$ of the outer region 36 and from respective individual MR data $38_5$ through $38_8$ of the middle region 35.

Figure 9:
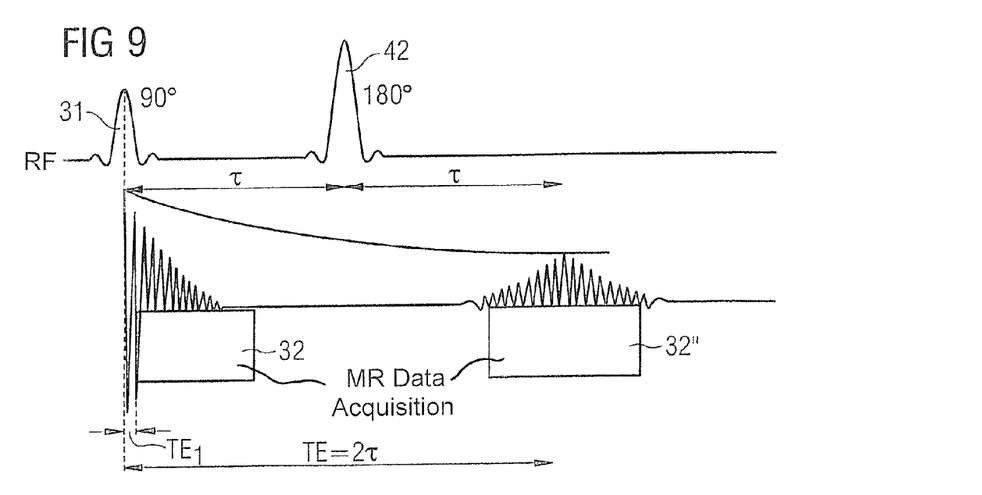
In FIG. 9 illustrates the present invention in comparison to the prior art.

FIG. 9 schematically shows the acquisition with a sequence according to the invention, with an ultrashort echo time $TE_1$ in comparison to an acquisition according to the prior art, wherein a spin echo sequence with an echo time TE in the millisecond range is used.

While the MR data acquisition according to the invention takes place in an MR data acquisition time period 32 which begins an ultrashort echo time $TE_1$ after the RF excitation pulse 31, the MR data acquisition according to the prior art takes place markedly later. According to the prior art, at a time period T after the RF excitation pulse an additional RF pulse 42 for rephasing, wherein the acquisition of the MR data during the MR data acquisition time period 32″ takes place only markedly after this second RF pulse 42. While the acquisition of the MR data according to the invention takes place in a time period of 10 to 1000 µs after the RF excitation pulse 31, the acquisition of the MR data according to the prior art takes place milliseconds after the RF excitation pulse 31.

Although modifications and changes may be suggested by those skilled in the art, it is the intention of the inventor to embody within the patent warranted hereon all changes and modifications as reasonably and properly come within the scope of their contribution to the art.

We claim as our invention:

1. A method of acquiring functional magnetic resonance (MR) data from a predetermined volume segment in the brain of an examination subject, comprising:
   from a control computer, operating an MR data acquisition unit, comprising an RF radiator and a gradient system, in order to execute a functional MR data acquisition sequence;
   from said control computer, in said functional MR data acquisition sequence, activating at least one pre-pulse selected from the group consisting of a T1-selected pre-pulse and a T2-selected pre-pulse that induce relaxation of nuclear spins in a predetermined volume segment of an examination subject, said relaxation having a relaxation duration, and during said relaxation duration, radiating an RF excitation pulse from said RF radiator that excites said nuclear spins in said predetermined volume segment of the examination subject, and operating said gradient system in order to activate at least one magnetic field gradient and acquiring functional MR data produced by excitation of the nuclear spins in said predetermined volume segment, during each of a plurality of predetermined echo times that occur after said RF excitation pulse and during said relaxation duration; and
   from said control unit, operating said MR data acquisition unit in order to cause each of said plurality of predetermined echo times that occur after said RF excitation pulse to be in a time period in a microsecond range between 10 µs and 1,000 µs.

2. A method as claimed in claim 1 wherein said plurality of predetermined echo times is 2 to 500 echo times.

3. A method as claimed in claim 1 comprising, from said control unit, operating said gradient coil system in order to ramp up multiple magnetic field gradients for spatial coding of said functional MR data, simultaneously with beginning acquisition of said functional MR data.

4. A method as claimed in claim 1 comprising, from said control unit, operating said gradient coil system in order to ramp up multiple magnetic field gradients before radiating said RF excitation pulse, in order to acquire said functional MR data.

5. A method as claimed in claim 4 comprising entering said functional MR data into an electronic memory representing k-space, at respective k-space points in k-space, by entering said functional MR data into k-space points in a middle region of k-space individually so that said functional MR data are entered into only one k-space point in said middle region of k-space per each RF excitation pulse.

6. A method as claimed in claim 1 comprising entering said functional MR data into an electronic memory representing k-space, comprising a plurality of k-space points, and dividing said k-space points in k-space into a middle region of k-space and an outer region of k-space, k-space consisting of said middle region and said outer region, and entering said functional MR data into k-space points in said middle region more often than entering said functional MR data into k-space points in said outer region.

7. A method as claimed in claim 6 comprising:
   entering said functional MR data into k-space repeatedly in multiple, successive time windows respectively coinciding with said plurality of predetermined echo times;
   for each time window, reconstructing multiple MR images of said predetermined volume segment of the brain of an examination subject from the functional MR data acquired in that time window;
   during each time window, entering said functional MR data into k-space points in a predetermined number of lines in said middle region of k-space, said predetermined number of lines corresponding to the number of said multiple MR images reconstructed from each time window; and
   during each time window, entering functional MR data into k-space points in said outer region once, and reconstructing thereafter each of said multiple MR images of said predetermined volume segment of the brain of an examination subject, using a respective time window from the functional MR data entered into the middle region and the outer region while the respective time window is occurring.

8. A magnetic resonance (MR) system comprising:
   an MR data acquisition unit comprising an RF radiator and a gradient system;
   a control computer configured to operate said MR data acquisition unit in order to execute a functional MR data acquisition sequence;
   said control computer, in said functional MR data acquisition sequence, being configured to operate said RF radiator to activate at least one pre-pulse selected from the group consisting of a T1-selected pre-pulse and a T2-selected pre-pulse that induce relaxation of nuclear spins in a predetermined volume segment of the brain of an examination subject, said relaxation having a relaxation duration, and to radiate during said relaxation duration, an RF excitation pulse that excites said nuclear spins in said predetermined volume segment of the brain of the examination subject, and being configured to operate said gradient system in order to activate at least one magnetic field gradient and acquire functional MR data produced by excitation of the nuclear spins in said predetermined volume segment of the brain of an examination subject, during each of a plurality of predetermined echo times that occur after said RF excitation pulse and during said relaxation duration; and said control computer being configured to operate said MR data acquisition unit in order to cause each of said plurality of predetermined echo times that occur after said RF excitation pulse to be in a time period in a microsecond range between 10 µs and 1,000 µs.

9. A method as claimed in claim 8 wherein said plurality of predetermined echo times is 2 to 500 echo times.

10. A non-transitory, computer-readable data storage medium encoded with programming instructions, said data storage medium being loaded into a computerized control system of a magnetic resonance (MR) apparatus, said MR apparatus also comprising an MR data acquisition unit comprising an RF radiator and a gradient system, and said programming instructions causing said control system to:

operate said functional MR data acquisition unit in order to execute a functional MR data acquisition sequence;

in said functional MR data acquisition sequence, operate said RF radiator in order to activate at least one pre-pulse selected from the group consisting of a T1-selected pre-pulse and a T2-selected pre-pulse that induce a relaxation of nuclear spins in a predetermined volume segment of the brain of an examination subject, said relaxation having a relaxation duration, and in order to radiate during said relaxation duration an RF excitation pulse from said RF radiator that excites said nuclear spins in said predetermined volume segment of the brain of the examination subject, and to operate said gradient system in order to activate at least one magnetic field gradient and acquire functional MR data produced by excitation of the nuclear spins in said predetermined volume segment of the brain of an examination subject, during each of a plurality of predetermined echo times that occur after said RF excitation pulse and during said relaxation duration; and operate said MR data acquisition unit in order to cause each of said plurality of predetermined echo times that occur after said RF pulse to be in a time period in a microsecond range between 10 µs and 1,000 µs.

11. A method as claimed in claim 10 wherein said plurality of predetermined echo times is 2 to 500 echo times.

* * * * *